United States Patent [19]
Dorney

[11] Patent Number: 6,091,665
[45] Date of Patent: *Jul. 18, 2000

[54] SYNCHRONOUS RANDOM ACCESS MEMORY HAVING COLUMN FACTOR COUNTER FOR BOTH SERIAL AND INTERLEAVE COUNTING

[75] Inventor: Timothy D. Dorney, Houston, Tex.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 09/072,890

[22] Filed: May 5, 1998

Related U.S. Application Data

[60] Provisional application No. 60/045,563, May 5, 1997.

[51] Int. Cl.[7] .................................................. G11C 8/00
[52] U.S. Cl. ..................................... 365/236; 365/230.01
[58] Field of Search .................................... 365/236, 233, 365/230.01

[56] References Cited

U.S. PATENT DOCUMENTS

| | | | |
|---|---|---|---|
| 4,458,357 | 7/1984 | Weymouth et al. | 365/236 |
| 4,525,800 | 7/1985 | Hamerla | 365/228 |
| 4,618,947 | 10/1986 | Tran et al. | 365/230 |
| 5,175,835 | 12/1992 | Beighe et al. | 365/230.01 |
| 5,321,665 | 6/1994 | Balistreri et al. | 365/230.05 |
| 5,418,744 | 5/1995 | Taoda | 365/236 |
| 5,789,938 | 8/1998 | Erickson et al. | 365/236 |
| 5,805,523 | 9/1998 | Lysinger | 365/236 |
| 5,812,488 | 9/1998 | Zagar et al. | 365/236 |
| 5,889,727 | 3/1999 | Hsu et al. | 365/233 |
| 5,923,614 | 7/1999 | Erickson et al. | 365/236 |

*Primary Examiner*—David Nelms
*Assistant Examiner*—Van Thu Nguyen
*Attorney, Agent, or Firm*—Frank D. Cimino; Robby T. Holland; Frederick J. Telecky, Jr.

[57] ABSTRACT

A synchronous dynamic random access memory (SDRAM) improves memory access time by incorporating into the column address path a bidirectional column factor counter.

53 Claims, 7 Drawing Sheets

TWO BIT BURST

POSITIVE INCREMENT

CF
10
01

IN TOP OR BOTTOM
OF 4 BITS

NEGATIVE INCREMENT

CF
10
01

IN TOP OR BOTTOM
OF 4 BITS

FOUR BIT BURST

POSITIVE INCREMENT

CF
0010
0100
1000
0001

NEGATIVE INCREMENT

CF
0010
0001
1000
0100

EIGHT BIT BURST

POSITIVE INCREMENT

| CFB | CFA |
|---|---|
| 0010 | 0010 |
| 0010 | 0100 |
| 0010 | 1000 |
| 0010 | 0001 |
| 0001 | 0010 |
| 0001 | 0100 |
| 0001 | 1000 |
| 0001 | 0001 |

OR

POSITIVE INCREMENT

| CFB | CFA |
|---|---|
| 1000 | 0010 |
| 1000 | 0100 |
| 1000 | 1000 |
| 1000 | 0001 |
| 0100 | 0010 |
| 0100 | 0100 |
| 0100 | 1000 |
| 0100 | 0001 |

CFB

CFA

| NEGATIVE INCREMENT | | | NEGATIVE INCREMENT | |
|---|---|---|---|---|
| CFB | CFA | | CFB | CFA |
| 0010 | 0010 | | 1000 | 0010 |
| 0010 | 0001 | | 1000 | 0001 |
| 0010 | 1000 | | 1000 | 1000 |
| 0010 | 0100 | OR | 1000 | 0100 |
| 0001 | 0010 | | 0100 | 0010 |
| 0001 | 0001 | | 0100 | 0001 |
| 0001 | 1000 | | 0100 | 1000 |
| 0001 | 0100 | | 0100 | 0100 |

CFB

CFA

HIGHEST CFD — 256 BURST OR NO INCREMENT FOR 8,4,2,1 BURST

CFC — 256 BURST OR NO INCREMENT FOR 8,4,2,1 BURST

CFB — 256 BURST

OR

8 BIT BURST OR NO INCREMENT FOR 4,2,1 BURST

CFA  256,8,4 BIT BURST

OR

2 BIT BURST

SYNCHRONOUS RANDOM ACCESS MEMORY HAVING COLUMN FACTOR COUNTER FOR BOTH SERIAL AND INTERLEAVE COUNTING

This is a Non Provisional application filed under 35 USC 119(e) and claims priority of prior provisional, Ser. No. 60,045,563 of inventor Timothy D. Dorney, filed May 5, 1997.

FIELD OF INVENTION

The invention is in the field of integrated circuits and relates general to memory devices and more specifically to column addressing.

BACKGROUND OF INVENTION

Present complementary metal oxide semiconductor (CMOS) circuits are frequently used for a variety of computer applications. Among the many uses, CMOS circuits are used in memory devices. Among memory devices, two general types are do random access memories (DRAMs) and synchronous dynamic random access memories (SDRAMs). Unlike typical DRAMs which use internal clock signals generated from he standard row address strobe (RAS_) and column address strobe (CAS_) signals issue by the microprocessor, SDRAMs use timing signals generated from the external system clock (which is the same clock the microprocessor uses). Hence, SDRAMs may operate at a much higher speed than DRAMs. U.S. Pat No. 5,386,385, issued Jan. 31, 1995, entitled "Method and Apparatus for Preventing Invalid Operating Modes and an Application To Synchronous Memory Devices", assigned to Texas Instruments Incorporated, discloses a SDRAM.

The SDRAM has an on-chip column address counter to facilitate access to the addressed memory cells. In operation, the first column address is provided to the SDRAM, and an internal counter generates subsequent column address locations based on a predetermined counting (Serial or Interleave) method and burst length.

In a column address counter, N counting circuits are required for a $2^N$ burst length. For example, eight counting circuits are required for a 256 bit burst. In a Serial counting method, when the counter reaches it's maximum count, all bits must roll over to all zeros. To accomplish the maximum to minimum transition, a signal (the carry bit) may have to ripple through an counting stages. Under high speed operation, this ripple delay may cause a bottleneck.

Traditional methods for improving the delay caused by the carry bit ripple has been to use look-ahead circuitry to anticipate when a carry is needed. Unfortunately, a pathological case exists when the first address loaded on the SDRAM is the maximum counting value. The look-ahead circuitry itself must ripple through a signal since it has no prior knowledge of the counter's status. As the system clock speed increases and/or the depth of the burst length is large, the ability to use column address counters is limited. What is required is a method to substantially reduce the number of stages a ripple signal must traverse.

It is accordingly an object of the invention to improve access speed to addressed memory cells. Other objects and advantages of the invention will be apparent to those possessing ordinary skill in the art having the benefit of the specification and drawings herein.

SUMMARY OF THE INVENTION

A SDRAM having a bi-directional column factor counter is presented as a method to achieve high speed operation with the added advantage of reduced silicon area requirements. By using a column factor counter instead of a column address counter, the number of stages the carry bit must traverse is greatly reduced. By using four states per ring and four rings, a 256 bit burst (4×4×4×4) can be implemented. At the same time, since only four stages exist, the ripple must only traverse three stages. This is roughly a 60% reduction in time to update the factor counters compared to the address counters. Furthermore, the factor counters have a repeated circuit layout which is easily optimized for layout area.

By using a factor counter, a high speed counter can be built which greatly reduces the carry bit ripple delay, supports both Serial and Interleave counting methods, and allows an optimized layout which has been shown to be smaller than a comparable column address counter. Finally, by using a column factor counter, less time is required between the generation of the column factors until the Y-select actually fires since the Y-select fires off of buffered column factors. A column address counter first generates column factors to fire the Y-select.

DETAILED DESCRIPTION OF PREFERRED EMBODIMENT

As will be fully explained below, in overview, a bi-directional column factor counter is included in the column address path of a SDRAM. Among the many advantages provided by the bidirectional column factor counter are the following:

Reduced delay between counts due to a reduced number of stages that a carry bit ripple must traverse.

Bi-directional operation to support both serial and interleave counting.

A very regular circuitry pattern which lends itself toward optimized layout.

Delay time between the counter increment and the Y-select firing has been reduced.

The time required to generate the initial load signal on the fast bit of a burst has not been wasted since the column factors are generated from column addresses during this time. Column address counters simply wait during this time.

Ultra-high speed operation (>200 MHz) if the count is maintained within the same column factor ring.

High speed operation (such as around 150 MHz) is possible by using the column factor counters.

A four bit counter ring has unique properties which make the condition for exiting a burst easier to identify.

Figure 1:
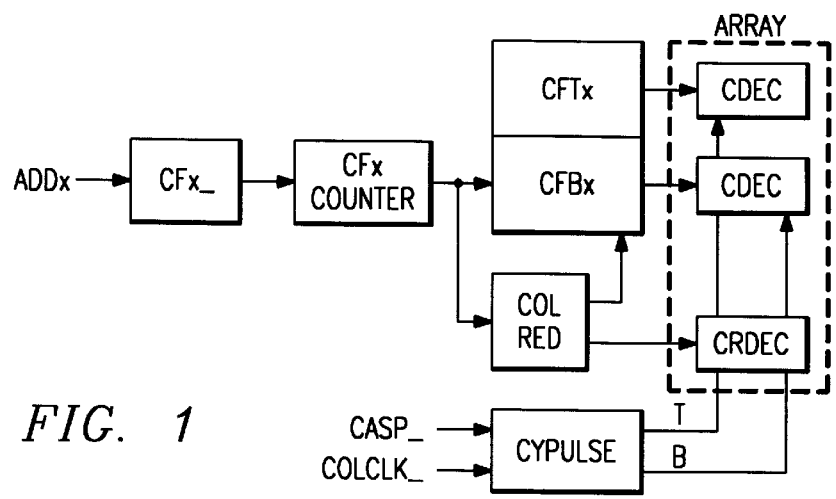
FIG. 1 illustrates in block diagram form a SDRAM incorporating a column factor counter according to a preferred embodiment of the invention.
Figure 2:
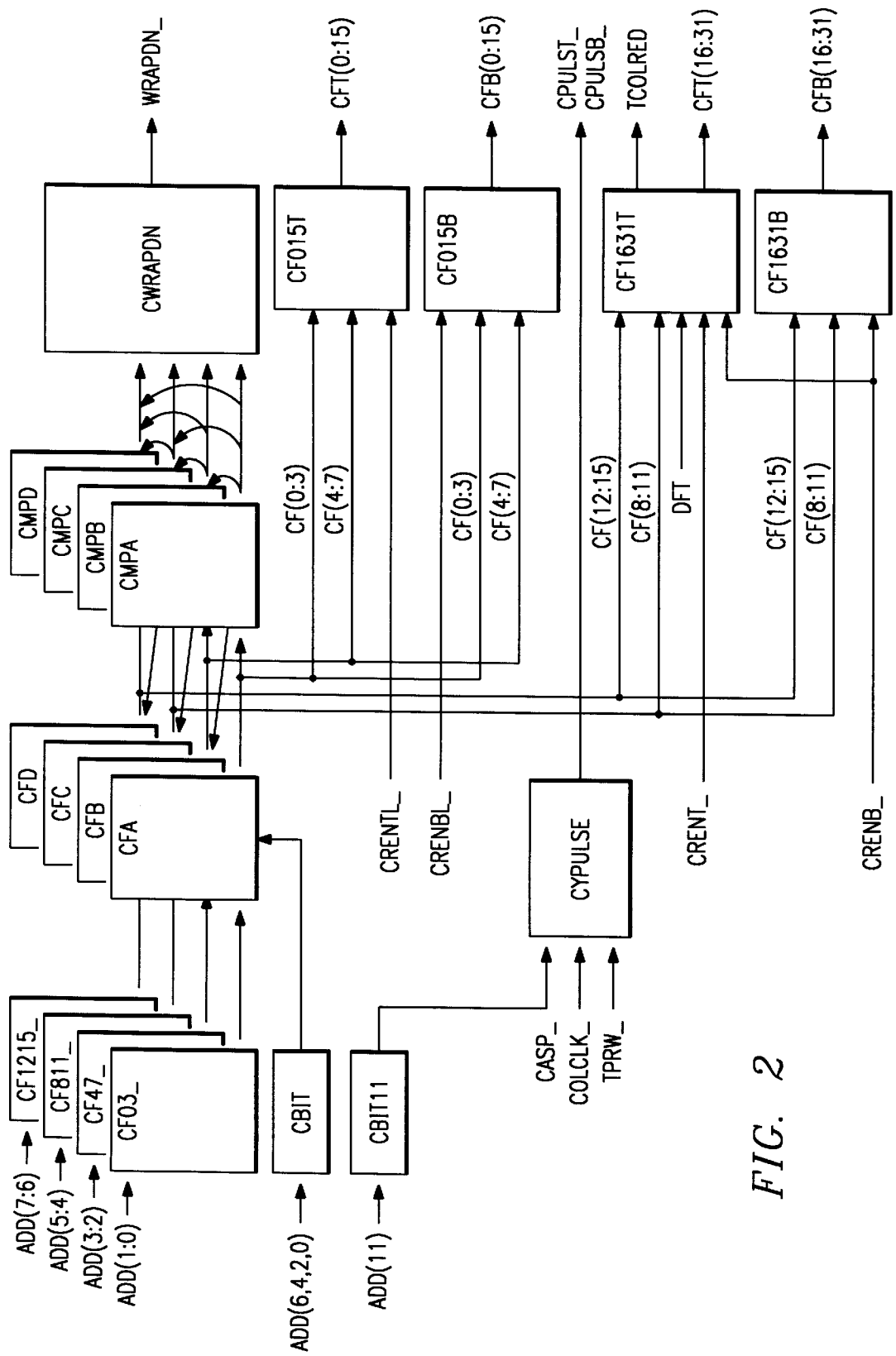
FIG. 2 illustrates in block diagram form the column path of the SDRAM of FIG. 1.

FIG. 1 shows the column path in block diagram for a SDRAM incorporating the bi-directional column factor generator according to a preferred embodiment of the invention while FIG. 2 is a slightly more detailed block diagram illustrating the column path. An overview of FIGS. 1 and 2 is presented next.

Architecturally, the SDRAM is 16 Megabits in size that is organized into 2 banks having 8 Megabits each. Each bank is divided into a top half and a bottom half. Each half is comprised of two quadrants. With reference to FIGS. 1 and 2, the column addresses, ADDx, enter the column factor generators, CFx_, (CF03_, CF47_, CF811_, CF1215_). These circuits use pairs of column addresses to generate four inverse column factors, The four groups of four inverse column factors feed the four column factor counters (CFA, CFB, CFC, CFD). The column factor counters latch the initial column factors. The counters also increment the column factors as determined by a mode register. As will be explained below, the circuitry supports both Serial and Interleave counting for 1, 2, 4, 8, and 256 bit bursts. The circuit block CMP(A–D) denotes a comparator circuit whose function will be explained below.

The resulting true column factors from the counters are used by both the column redundancy and the column factor buffers, CFTx and CFBx (CF015T, CF015B, CF1631T, CF1631B). T denotes the top half of an array bank and B denotes the bottom half of an array bank. The buffer circuits take two groups of four factors and output 16 total global factors per circuit. These global factors are provided for both the top and bottom banks of the memory array, and are buffered to drive the entire length of the array. One global factor from each group of 16 will be high to select one of 256 column decoders. When a column address is selected, four column Y-selects will fire, one in each half of two quadrants.

In FIGS. 1 and 2, the input signal CASP_ is derived from the column address strobe signal CAS_, and as will be explained in more detail below, fires off of the first clock signal to begin the count. The input signal COLCLK_ is generated from the external system clock and counts the remainder of clock signals to end the count. The circuit CYPULSE generates the signals CYPULST_ and CYPULSB_ for the top and bottom memory banks, respectively. The circuit block CWRAPDN generates a signal used to stop COLCLK_.

Finally, no Y-select can fire based only on the column factors. A global pulse signal (CYPULST_ for the top bank and CYPULSB_ for the bottom bank) will allow the Y-selects to fire. By using a global pulse signal, both normal and redundant Y-selects will maintain similar timings, the input/output (I/O) circuitry can be timed with respect to the column circuitry, and timing skew due to propagation delay is reasonable and controllable. (Note that the normal Y-select OR the redundant Y-selects will fire. They are not used together in the same cycle.)

With reference to FIGS. 1 and 2, several of the circuit blocks are discussed in more detail.

CF03_(Column Factors 0_ through 3_)
inputs: ADD0, ADD1
outputs: CF0_, CF1_, CF2_, CF3_

CF03_ creates the inverse of the column factors (0–3) from column addresses 0–1. This circuit uses only flow through logic. Since there is a delay between the presentation of the column addresses and the latching pulse for the factors (CASP_), the creation of the column factors is moved to the earliest stage of the column path.

Blocks CP47_—CF1215 operate similarly as block CF03_. CF47_ uses CA2 and CA3. CF811_ uses CA4 and CA5. CF1215_ uses CA6 and CA7.

CBIT
inputs: CASP_, ADD0, ADD2, ADD4, ADD6
outputs: BIT0, BIT2, BIT4, BIT6

CBIT is a latching circuit required to increment, in the proper direction, each of the column factors. When the initial cycle of a burst occurs, CASP_ pulses low. This low going pulse is adjustable in time to create the complementary internal latching signals which latch column addresses 0, 2, 4, and 6, through four identical latching circuits.

CFA (Column Factor Counter A)
inputs: WRAP2, BIT0, INTERLV, COLCLK_, CASP_, CF0_, CF1_, CF2_, CF3_
outputs: CF0, NXTCF0, CF1, NXCF1, CF2, NXTCF2, C3, NXTCF3

CFA is the lowest order column factor counter of the four counters. It provides special counting operation for a 2 bit burst, and follows the same method for the 4, 8, and 256 bit burst. A one bit burst requires no increment methodology.

The counter has four identical latching mechanisms which provides tree operations. The first is a flow through path when CASP_ pulses low on the initial count of a burst. The CFx_ signals are simply inverted to create the CFx signals and are latched. The second operation is a 2:1 mux at the beginning of the latching chain mechanism which determines whether the input for the counting ring comes from the stage before or after the current position in the ring.

The final operation is the two stage latching mechanism. The first stage, next to the 2:1 mux, holds the new incoming data from the previous stage in the ring. The second latch is part of the output structure to hold the current value of that stage in the counting ring.

The last section of the counter is the control logic, which is located at the top of each of the column factor counter schematics (CFA, CFB, CFC, CFD). For CPA, a single 4 bit ring or a two, 2 bit ring is possible. The two, 2 bit rings are required for a 2 bit burst. The 4 bit ring is used for the 4, 8, and 256 bit burst operations. WRAP2 high indicates that a two bit burst is selected. WRAP2 low indicates that a two bit burst is not the current burst length. BITO in conjunction with INTERLV determine the rotation of the ring. INTERLV high indicates that the counting mode is "Interleave" and not "Serial".

Finally COLCLK_ is a low going pulse to increment the counter. The gate sizes have been optimized to reduce the layout area required. (The maximum gate width before another channel is required is 20 um.)

CFB (Column Factor Counter B)—CFD are similar in construction and operation as CFA. The only modification is the control inputs to determine the counter rotation direction based on the mode, and the starting input address. This modification will be explained with the description of FIG. 3.

CMPA (Comparitor for Column Factor Counter A)
  inputs: INTERLV, RID, MRS, WRAPF, WRAP8, CASP_, CF0, CF0_, NXTCF0, CF1, CF1_, NXTCF1, CF2, CF2_, NXTCF2, CF3, CF3_, NXTCF3
  outputs: ENABLEB, CMPA, BITCPL CMPA is one of the four comparitor circuits (CMPA—CMPD) which are similarly constructed. The circuit is comprised of four identical input paths, one for each factor. Depending on which initial factor is high, the counting method and the burst length, NXTCFx from CFA are used by CMPA to increment the CFB ring. This pattern is repeated as seen in FIG. 2. NXTCFx from CFB is input to CMPB to determine when CFC increments. CMPC increments CFD. CMPD has no associated circuit to increment, but an exit condition to generate WRAPDN_ is required.

The CFx signals will be used to indicate when an exit signal (CMPA) should be generated. This exit signal works in conjunction with the signals from the other CMPx circuits to generate CWRAPDN_. Also, the MRS/RID signals are used to initialize the circuits on power up so that no contention will exist. Finally, CASP_ is used to latch the initial column factor values, so the exit and increment logic has a reference.

WRAPDN (Burst Wrap Done)
  inputs: CLK1, CASP_, COLCLK_, CMPA, CMPB, CMPC, CMPD, WRITE, WRAPW, WRAP1, WRAP2
  outputs: WRAPDN_

This circuit is responsible for indicating to the Control section when the burst length has been met so that no firer COLCLK_ signals increment the counters. WRAPDN_ must go low very shortly after the eternal clock goes low, and before the BURST LENGTH+1 external clock goes high.

The WRAPx signals come from the Mode Register to determine the burst length of the current cycle. COLCLK_ is used for the 4, 8, and 256 bit burst pipeline since it is only active after one cycle into the count. An internal counter in CWRAPDN handles the 1 and 2 bit burst lengths.

CYPULSE (Y-Select Pulse)
  inputs: PR0, RAS0, BIT11, TPRW_, RAS1, PR1, CASP_, COLCLK_, RID, PROBEC
  outputs: CYPULST_, CYPULSB_

CYPULSE generates a bank specific low going pulse to fire the Y-selects, irrespective of whether the selected column decoder is normal or redundant. Additional logic is provided to disable the pulse if a burst sequence is interrupted with a precharge command. In a parallel test mode, both banks can fire at the same time.

CF015T (Column Factor 0 through 15 Top)
  inputs: CRENTL_, CF0, CF1, CF2, CF3, CF4, CF5, CF6, CF7
  outputs: CF0T, CF1T, CF2T, CF3T, CF4T, CF5T, CF6T, CF7T, CF8T, CF9T, CF10T, CF11T, CF12T, CF13T, CF14T, CF15T CF015T combines the column factors CF0 through CF7 to produce 16 unique combinations. These signals are buffered to drive across the entire device. The resulting outputs go directly to the column decoders (Y-select generators). The CRENTL_ is the signal from the column redundancy path to disable the normal pathway.

CF015B, CF1631T, and CF1631B are similar in construction and operation as CF015T.

CDEC (Column Decoder)
  inputs: CFXK, CFYK, YPULSK_
  outputs: YSZ

This Y-select generator is dependent on two column factors to select one of 256 (four of 1024) column decoders. The Y-select is designed to fire off of the YPULSE signal since it is the last to fire and the first to reset.

FIG. 3 illustrates an electrical schematic of the circuitry forming the column factor generators CFx_. However, before explaining the operation of the electrical schematic, an explanation of Serial and Interleave counting is in order.

Overview of Serial and Interleave Counting

The column factor counter is different from the column address counter in that the column address can have any combination of 1's and 0's. The column factors, however, are grouped into sets in which only one of the factors in the group is at the opposite state from the others. For this discussion, a "1" will be assumed as the unique state.

The column address is used to generate the column factors to start the counting process. Two column addresses can be used to create a $2^2$ (=4) bit ring. (Similarly, one CA produces a two bit CF ring; three CA produce a eight bit CF ring; and so on. This comes from the fact that $CF=2^{CA}$.)

To translate column addresses into column factors, the following table is offered:

| CA | CF |
|---|---|
| 0 | 01 |
| 1 | 10 |
| 00 | 0001 |
| 01 | 0010 |
| 11 | 1000 |
| 000 | 00000001 |
| 001 | 00000010 |
| 010 | 00000100 |
| 011 | 00001000 |
| 100 | 00010000 |
| 101 | 00100000 |
| 110 | 01000000 |
| 111 | 10000000 |

In the Serial mode, the counting method is the same as adding one to the current value. For example, if the current binary number was 1000, the next serial number would be 1001 in binary. When the maximum number is reached, the count rolls over all zeros. For example, a four position binary counter would increment from 1111 to 0000. The on limitation on this method is the burst length.

The burst length determines how many bits are allowed to increment. For a two bit burst, only the least significant bit is allowed-to change. For a four bit burst, the two least significant bits are allowed to change. For an eight bit burst, the three least significant bits are allowed to change. For example, assume that a Serial four bit counter had a four bit burst with a starting address of 1001. The following table shows the counting sequence:

| Cycle | Column Address 3-0 |
|---|---|
| N | 1001 |
| N+1 | 1010 |
| N+2 | 1011 |
| N+3 | 1000 |
| N+4 | 1000 |

Note that the two most significant addresses did not change and that the two least significant addresses rolled over to "00" when the maximum value "11" was reached. Also, note that the count stops after the fourth cycle since this was a four bit burst. The burst would require an activate command to restart the count.

In the Interleave mode, two views are prevalent. The first is to view each address as an oscillator, with the least significant address having the highest frequency. The next higher address would half the frequency of the address before it. Note how the least significant address changes every cycle, while the next higher address changes every other cycle in the following Interleave four bit burst example:

| Cycle | Column Address 3-0 |
|---|---|
| N | 1001 |
| N+1 | 1000 |
| N+2 | 1011 |
| N+3 | 1010 |
| N+4 | 1010 |

As in the Serial mode, the two most significant addresses do not change since this is a four bit burst. Four different combinations are possible by only modifying the two least significant addresses.

The second view works by creating a serial count with a starting value of all zeros. The count is continued in a sequential method, but any address which started with a "1" causes that address column to be inverted. For example, again use a four bit burst with a staring address of 1001. In the table below, the Serial count with a starting address of all zeros is shown. By inverting both the most and the least significant address columns, the proper Interleave count is achieved.

| Cycle | Serial Count from 0000 | Column Address 3-0 |
|---|---|---|
| N | 0000 | 1001 |
| N+1 | 0001 | 1000 |
| N+2 | 0010 | 1011 |
| N+3 | 0011 | 1010 |
| N+4 | 0011 | 1010 |

The preferred embodiment uses his latter method to create an Interleave count using the column address counters.

Since the ripple delay for a count from "1111111111" to "0000000000" was too long for high speed operation of around 150 MHz, an investigation into a column factor counters instead of a column address counters was performed.

The 16 Megabit SDRAM uses four column factor counters, each with four factors, to support the 256 bit burst for the x16 I/O device. Two addresses are used to create four column factors in each of the counters. The following table is offed to show all possible combinations:

| Column Address Bits | Resulting Column Factors |
|---|---|
| 00 | 0001 |
| 01 | 0010 |
| 10 | 0100 |
| 11 | 1000 |

When a factor group is incremented in a Serial mode, the "1" moves from the current factor to the next higher factor. If the current factor is in the highest position, the "1" moves to lowest factor position. In other words, the factors move circularly. In a four factor ring, for example, the counter would increment in the following manner depending on the starting information.

| Cycle | CF 3-0 | CF 3-0 | CF 3-0 | CF 3-0 |
|---|---|---|---|---|
| N | 0001 | 0010 | 0100 | 1000 |
| N+1 | 0010 | 0100 | 1000 | 0001 |
| N+2 | 0100 | 1000 | 0001 | 0010 |
| N+3 | 1000 | 0001 | 0010 | 0100 |

Figure 4:
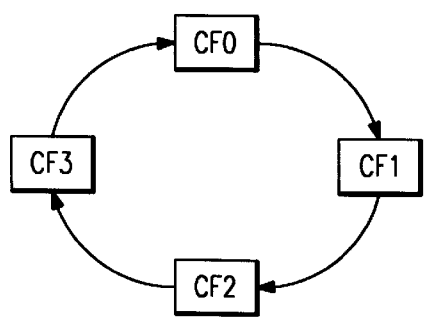
FIG. 4 is a block diagram illustrating clockwise rotation in a four ring counter.

Another way to look at this information is to place the column factors (CF) in a ring as illustrated in FIG. 4. When the ring is incremented, the "1" travels from the current state to the next according to the direction of rotation. The above example shows a Serial counting methodology. An Interleave counting methodology is also possible.

Recall that for an Interleave count, the column address counts in a sequential method starting at all zeros, then inverts any column of addresses which starts with a "1". By using the previous column address Interleave example, the pattern of column factor movement can be observed. The two most significant addresses form column factors 7-4, and the two least significant column addresses form column factors 3-0.

| Cycle | Serial Count | Column Address 3-0 | Column Factors 7-0 |
|---|---|---|---|
| N | 0000 | 1001 | 0100 0010 |
| N+1 | 0001 | 1000 | 0100 0001 |
| N+2 | 0010 | 1011 | 0100 1000 |
| N+3 | 0011 | 1010 | 0100 0100 |
| N+4 | 0011 | 1010 | 0100 0100 |

Further investigation of how a column factor counter behaves in an Interleave mode results in the following table:

| Cycle | CF 3-0 | CF 3-0 | CF 3-0 | CF 3-0 |
|---|---|---|---|---|
| N | 0001 | 0010 | 0100 | 1000 |
| N+1 | 0010 | 0001 | 1000 | 0100 |
| N+2 | 0100 | 1000 | 0001 | 0010 |
| N+3 | 1000 | 0001 | 0010 | 0001 |

Note that the counting "rotation" is the same as the Serial count when the starting address is even. When the starting address is odd, as in the first and third columns from the right in the above example, the rotation is reversed. This sets up the basis for Serial versus Interleave factor counting. Serial and Interleave counting are the same, except when the starting column address is odd and the Interleave method is in use. In this case, the direction of rotation is changed.

Multiple rings can be formed. The first ring increments the second when a certain condition is met. Likewise, the second ring will increment a third ring when a certain condition is met, and so on. The condition depends on the needs of the design, but in this case two increment conditions are possible. The first is when four counts on the previous ring increment the next ring (Interleave mode). The second is that the next ring increments whenever the previous rings increments from the highest position back to the lowest (Serial mode).

To give examples of both, assume we have two, four factor rings. In the first case, the second ring will increment after the first ring has had four increments from an external clock. This is an Interleave mode example.

| Cycle | RING 2<br>CF 7-4 | RING 1<br>CF 3-0 |
|---|---|---|
| N | 0010 | 0010 |
| N+1 | 0010 | 0001 |
| N+2 | 0010 | 1000 |
| N+3 | 0010 | 0100 |
|  | Increment |  |
| N+4 | 0001 | 0010 |
| N+5 | 0001 | 0001 |
| N+6 | 0001 | 1000 |
| N+7 | 0001 | 0100 |
|  | Increment |  |
| N+8 | 1000 | 0010 |

In the second case, the second ring increments as the first ring passes the highest position. This is a Serial mode example.

| Cycle | RING 2<br>CF 7-4 | RING 1<br>CF 3-0 |
|---|---|---|
| N | 0010 | 0010 |
| N+1 | 0010 | 0100 |
| N+2 | 0010 | 1000 |
|  | Increment |  |
| N+3 | 0100 | 0001 |
| N+4 | 0100 | 0010 |
| N+5 | 0100 | 0100 |
| N+6 | 0100 | 1000 |
|  | Increment |  |
| N+7 | 1000 | 0001 |
| N+8 | 1000 | 0010 |

Note that in the first case, the second ring increments after four counts, irrespective of the starting value. Conversely, the second case increments whenever the first ring counts from 1000 to 0001.

The comparitor, CMPx, performs the functions necessary to update the next higher ring and generate an exit pulse for its associated ring when the burst length has been met. The basic operation requires that the original starting CFx's be latched for comparison. The single unique bit of the original CFx allows passgates to be opened depending on the burst length and the method of incrementing (Serial or Interleave). The Serial mode always increments the next ring when the "1" transitions from highest position to the lowest position. The Interleave mode increments the next higher ring whenever the count moves to its original starting location.

In the comparitor CMPA, for example, when the Serial mode is used and NXICF0 goes high, the CFB ring will be allowed to increment on the next COLCL__. This is equivalent to saying that CF3 is high (CF3 eventually equals NXTCF0 in the Serial mode). On the next count, the CFA ring increments from CF3 to CF0 and the CFB ring moves one position. In the Interleave mode, when the NXTCFx is equal to the originally latched CFx, on the next count, the CFB ring will be incremented. This is required because NXTCFx states what the CF value that will occur on CFx on the next count. If they are equal (the stored CFx from the initial start of the count and the current NXICFx) then on the next count, the ring will have completed a rotation.

One final consideration when using multiple rings is the rotation direction for each ling in the Interleave mode. Each ring's rotation is determined solely by the lowest bit of the column addresses associated with column factor generation for that ring. For example, an eight bit column address can be broken down into four, two bit segments. Each two bit column address segment will produce a four bit column factor ring. This means that four, 4 bit CF rings will exist In each of the four, two bit CA segments, the low order bit must be considered when determining the direction of rotation for that CF ring. Consider the starting CA 11001001. This produces four, two bit segments 11-00-10-01. The first and last CF ring will increment backwards (negative direction) since they are odd (the least significant bit is "1"), while the middle two will increment in the forward (positive direction).

Another requirement is that each comparison circuit must generate an exit signal so that when a burst cycle is nearing completion, COLCLK__ can be stopped at the appropriate time. A two stage look-ahead comparitor is needed. The counters must be able to handle differing burst lengths. Consider a four bit burst with a Serial count.

| CF (All possible starting positions) | | | | Count |
|---|---|---|---|---|
| 0001 | 0010 | 0100 | 1000 | 1 |
| 0010 | 0100 | 1000 | 0001 | 2 |
| 0100 | 1000 | 0001 | 0010 | 3 |
|  |  |  |  | <-- Exit pulse generation |
| 1000 | 0001 | 0010 | 0100 | 4 |

The exit pulse must be generated at the indicated point so that the global exit signal, WRAPDN__, fires when count four occurs.

Similarly for a four bit interleave count:

| CF (all possible starting positions) | | | | Count |
|---|---|---|---|---|
| 0001 | 0010 | 0100 | 1000 | 1 |
| 0010 | 0001 | 1000 | 0100 | 2 |
| 0100 | 1000 | 0001 | 0010 | 3 |
|  |  |  |  | <-- Exit pulse generation |
| 1000 | 0100 | 0010 | 0001 | 4 |

The exit pulse for both of the above examples should be generated between count three and four. Analysis of this operation is aided if the factor values are periodized by copying values to either side of the original set. Only one position of each of the periodization is shown. For the example below, the bits in between the lines are the actual factors, while The bit on either side of the lines is the periodized value.

If we take two examples

| CF0 | CF 3210 | CF3 | CF0 | CF 3210 | CF3 |
|---|---|---|---|---|---|
| 0 | 0010 | 0 | 0 | 0010 | 0 |
| 0 | 0100 | 0 | 1 | 0001 | 0 |
| 0 | 1000 | 1 | 0 | 1000 | 1 |
| 1 | 0001 | 0 | 0 | 0100 | 0 | and realize that it is a ring, so that we can add bits on either side to represent the cyclic nature of this counter, we notice that the exit comparison signal should occur when the current count is two positions away from the starting position. This is true regardless of whether the Serial or Interleave mode is used. This is how the logic should be organized for the exit signal, but the two bit burst (as well as the one bit burst) are not comprehended by this approach.

By the time the position of the "1" has moved two away from the starting position, the exit signal should have already occurred for the one and two bit burst cases. Due to this reason, the exit signal generation has been moved to the CWRAPDN circuit which combines all the independent zing counter exit signals and generates the global signal WRAPDN__.

Note that an eight bit ring does not allow for this exit condition. The four bit ring is unique in its symmetry! Also, the eight bit ring is harder to break down into the two and four bit burst cases.

There is one final consideration which must be considered—when to exit when multiple revolutions are concerned.

Consider the following cases with an 8 bit burst:

|  | CFB | CFA | CFB | CFA | CFB | CFA |
|---|---|---|---|---|---|---|
| Starting position > | 0001 | 0001 | 0001 | 0010 | 0001 | 0100 |
|  | 0001 | 0010 | 0001 | 0100 | 0001 | 1000 |
|  | 0001 | 0100 | 0001 | 1000 | 0010 | 0001 |
|  | 0001 | 1000 | 0010 | 0001 | 0010 | 0010 |
|  | 0010 | 0001 | 0010 | 0010 | 0010 | 0100 |
|  | 0010 | 0010 | 0010 | 0100 | 0010 | 1000 |
|  | 0010 | 0100 | 0010 | 1000 | 0001 | 0001 |
| Exit Generation > |  |  |  |  |  |  |
|  | 0010 | 1000 | 0001 | 0001 | 0001 | 0010 |

First, notice that CFB for the first two cases has its value, when the exit generation should occur, different from its starting value. In the last case, the CFB ring has incremented back to its original position. The CFB will always increment back to its staring position so long as the CFA starting position is NOT 0001 or 0010. Extending the example to the 256 bit burst and the Interleave mode, the following design additions are required:

1. The two lowest bits in CFA are combined to generate the signal BITCFL. If the starting case is 0001 or 0010 in CFA, BITCFL will be high.
2. Since in the eight bit burst the CFB rings are split into two, two bit rings, the exit conditions now depend on CFx or NXTCFx. To decide between which to use,

| INTERLV signal | = 1 Interleave Mode |  |
|---|---|---|
|  | = 0 Serial Mode |  |
| Interleave | BITCFL | Use |
| 0 | 0 | CFx |
| 0 | 1 | NXTCFx |
| 1 | 0 | NXTCFx |
| 1 | 1 | NXTCFx |

This is true irrespective of burst length (8 or 256) since the factor counters change length (one ring with four positions or two rings with two positions each) depending on the mode.

3. Whenever a ring is not required for the specific burst length, its exit compare signal should be high.

Overview of the Electrical Design

To implement this design, a bi-directional ring counter is needed. Because of the requirements to have a 1, 2, 4, 8, and 256 bit burst, it is decided to utilize four, four bit ring counters to handle the eight bit column address.

FIGS. 5–8 show all the possible cases. (A single position on the ring is illustrated I for Input and O for Output). For the one bit burst, no counting is necessary. The one bit burst is not a unique case. FIGS. 5a and 5b illustrate a two bit positive and negative burst, respectively. FIGS. 6a and 6b similarly illustrate a four bit burst FIGS. 7a and 7b illustrate eight bit burst positive increments while FIGS. 7c and 7d illustrate negative increments. FIGS. 8a–8f show all four of the rings in all burst length cases. In FIGS. 8a–8f, the "*" denotes a negative direction increment. For CFA, a negative increment is used when CAO=1. For CFB, a negative increment is used when CA2=1. For CFC, a negative increment is used when CA4=1. For CFD, a negative increment is used when CA6=1.

It is apparent in FIG. 8 that a ring counter can rotate in two possible directions since the Output position has two possible Inputs. A design to handle the bi-directional nature of the count is the electrical schematic disclosed in FIGS. 3a and 3b.

Figure 3C:
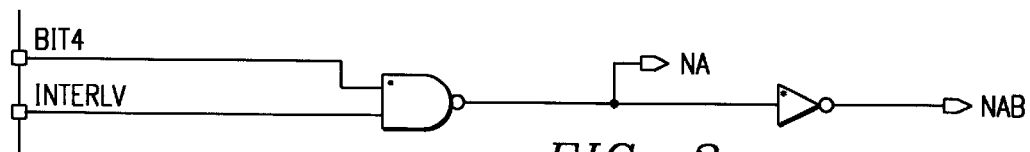
FIG. 3c is an alternate electrical schematic of a column factor counter directional control illustrated in section 10 of FIG. 3a for CFC and CFD of FIG. 2.
Figure 3D:
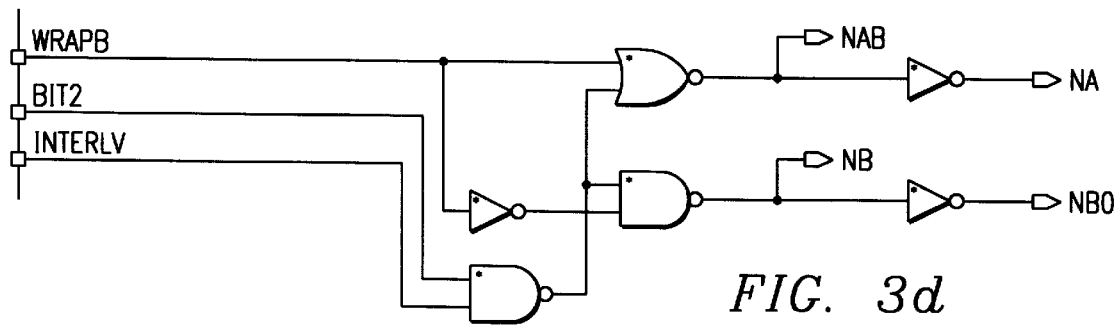
FIG. 3d is an alternate electrical schematic of a column factor counter directional control illustrated in section 10 of FIG. 3a for CFB of FIG. 2.
Figure 3A:
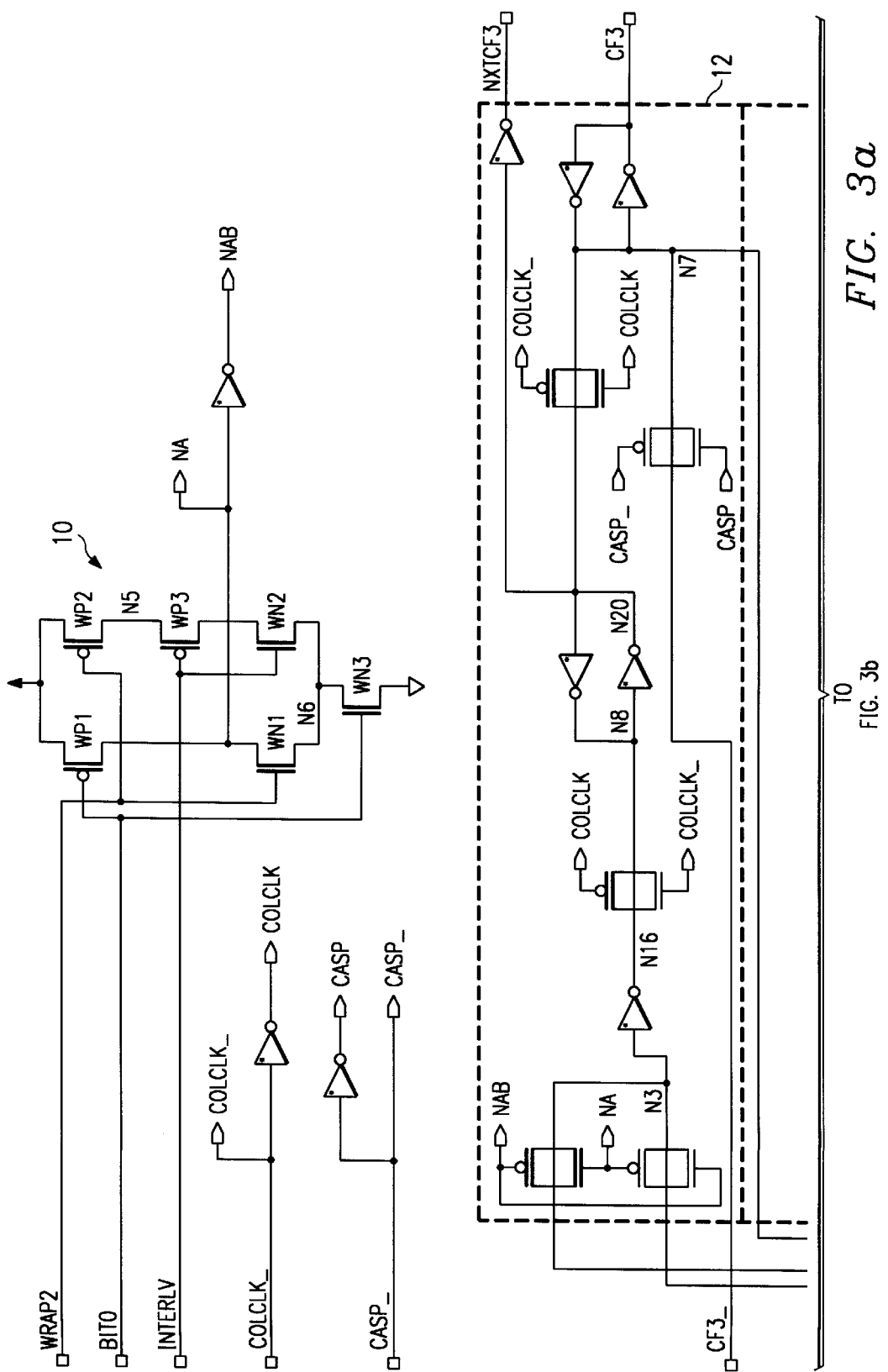
FIGS. 3a and 3b are electrical schematics of a column factor counter illustrated in FIGS. 1 and 2.
Figure 3B:
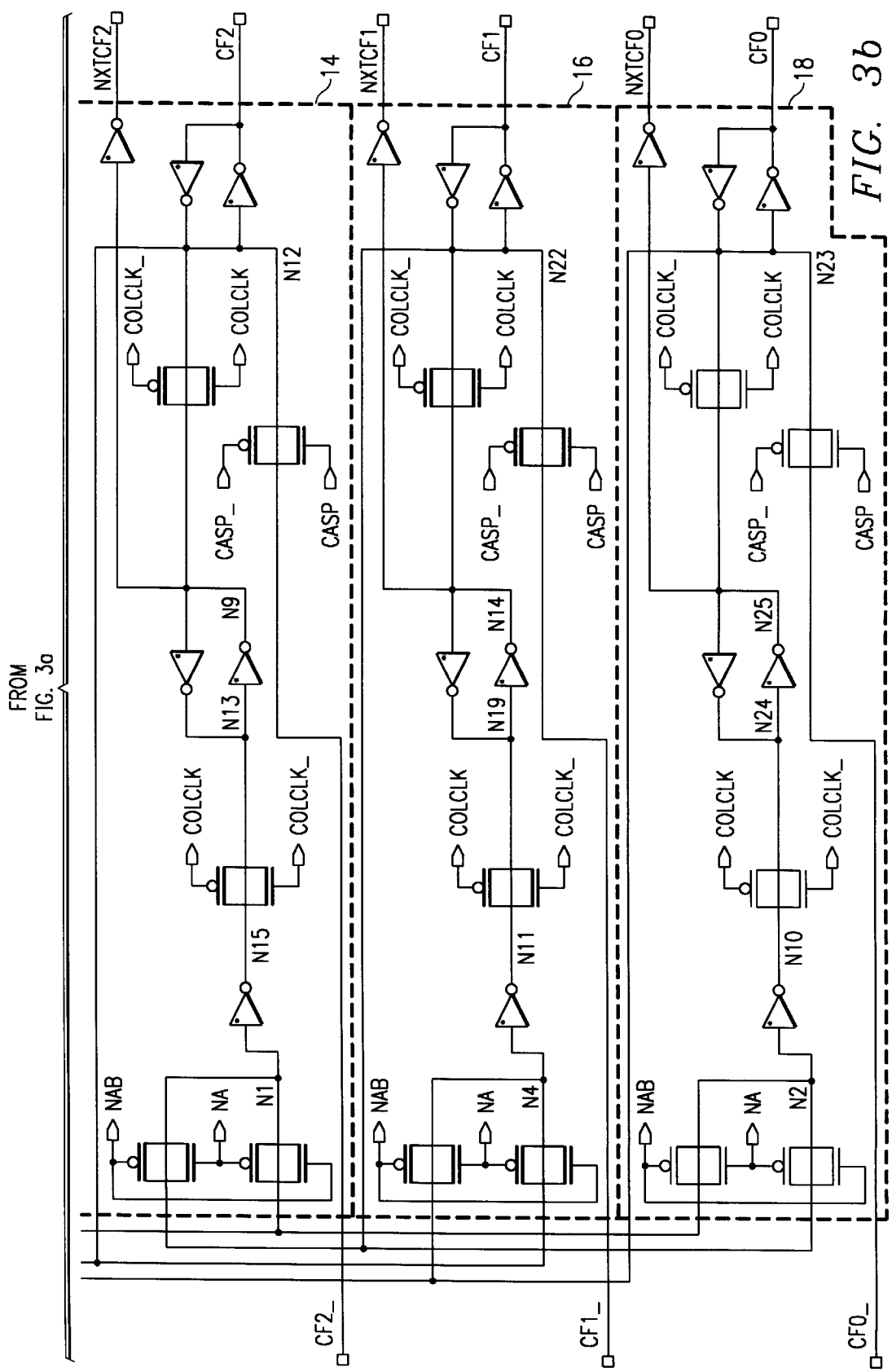
Figure 5A:
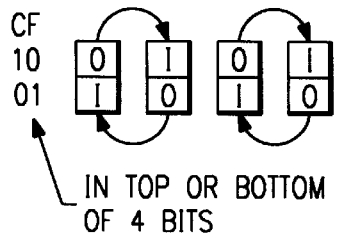
FIG. 5a illustrates a two bit burst mode positive increment.
Figure 5B:
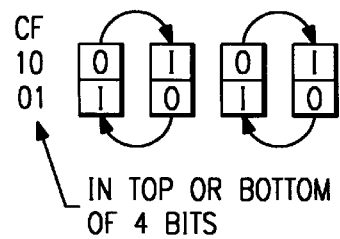
FIG. 5b illustrates a two bit burst mode negative increment.
Figure 6A:
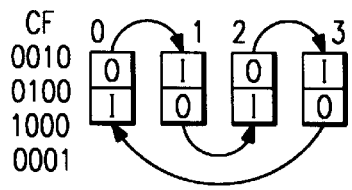
FIG. 6a illustrates a four bit burst mode positive increment.
Figure 6B:
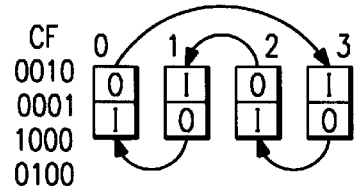
FIG. 6b illustrates a four bit burst mode negative increment.
Figure 7A:
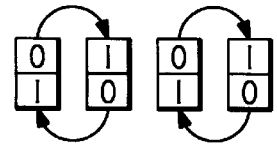
FIGS. 7a and 7b illustrate eight bit burst positive increment.
Figure 7B:
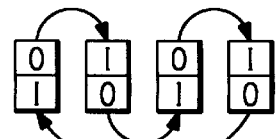
Figure 7C:
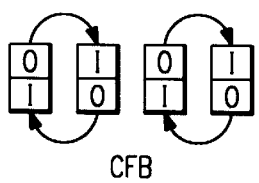
FIGS. 7c and 7d illustrate eight bit burst negative increment.
Figure 7D:
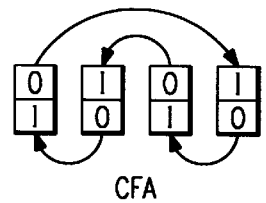
Figure 8A:
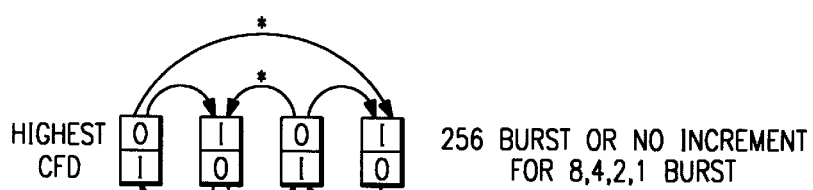
FIGS. 8a–8f show all four rings in all possible burst lengths, and increment directions.
Figure 8B:
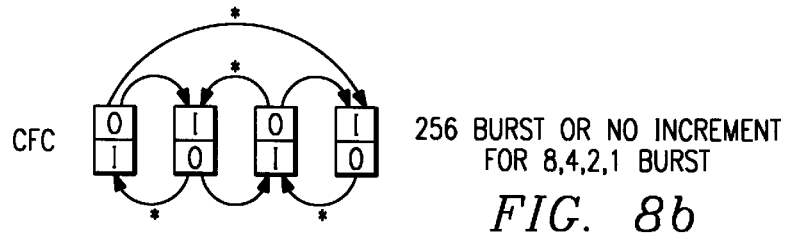
Figure 8C:
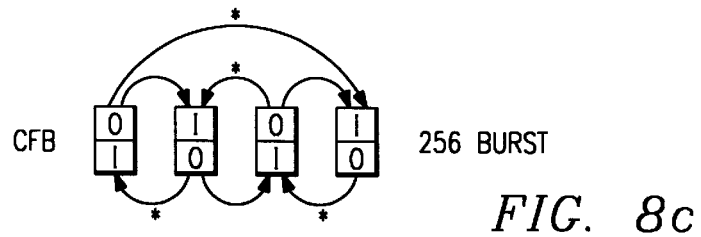
Figure 8D:
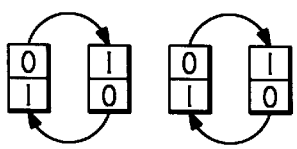
Figure 8E:
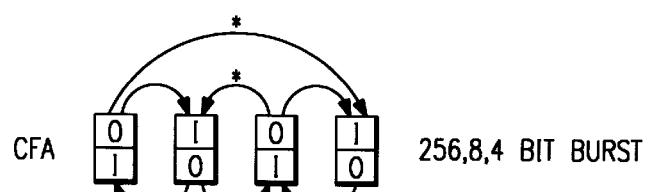
Figure 8F:
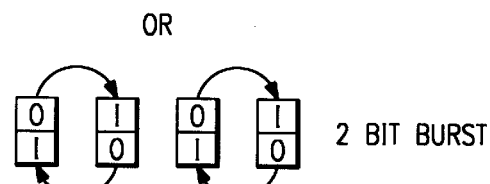

In FIGS. 3a and 3b, the column factor counter CPA, which is the lowest order column factor counter of the four counters (CFA–CFD), is illustrated The other counters are similarly constructed. The circuit receives the following inputs signals:

WRAP2, BIT0, INTERLV, COLCLK__, CASP__, CF0__, CF1__, CF2__, CF3__

The circuit generates the following outputs:

CF0, NXTCF0, CF1, NXTCF1, CF2, NXTCF2, CF3, NXTCF3

The input signals and outputs will be described below. CFA provides special counting operation for a 2 bit burst, and follows the same method for the 4, 8, and 256 bit burst. A one bit burst requires no increment methodology.

In overview, the circuit of FIGS. 3a and 3b has four identical latching mechanisms which provides three operations. The first is a flow through path when CASP__ pulses low on the initial count of a burst. The CFx__signals are simply inverted to create the CFx signals and are latched. The second operation is a 2:1 mux at the beginning of the latching chain mechanism which determines whether the input for the counting ring comes from the stage before or after the current position in the ring. The final operation is the two stage latching mechanism. The first stage, next to the 2:1 mux, holds the new incoming data from the previous stage in the ring. The second latch is part of the output structure to hold the current value of that stage in the counting ring.

In FIG. 3a, the last section of the counter is the control logic I/O, which is located at the top of the schematic. For CFA, a single 4 bit ring or two, 2 bit rings are possible. The two, 2 bit rings are required for a 2 bit burst. The 4 bit ring is used for the 4, 8, and 256 bit burst operations. WRAP2 high indicates that a two bit burst is selected. WRAP2 low indicates that a two bit burst is not the current burst length BIT0 in conjunction with INTERLV determine the rotation of the ring. INTERLV high indicates that the counting mode is "Interleave" and not "Serial". COLCLK__is a low going pulse in FIGS. 3a and 3b to increment the counter. The following table shows the effect of signals WRAP2, BIT0 and INTERLV on signal NA and NAB:

| WRAP2 | B1T0 | INTERLV | NA | NAB |
|---|---|---|---|---|
| X | 0 | X | 1 | 0 |
| X | 0 | X | 1 | 0 |
| 0 | 1 | 0 | 1 | 0 |
| 0 | 1 | 1 | 0 | 1 |
| X | 0 | X | 1 | 0 |

-continued

| WRAP2 | B1T0 | INTERLV | NA | NAB |
|---|---|---|---|---|
| X | 0 | X | 1 | 0 |
| 1 | 1 | 0 | 0 | 1 |
| 1 | 1 | 1 | 0 | 1 |

An explanation of the above table's meaning is the following:
1. NA is the opposite of NAB.
2. If NA is high, the ring counter moves in a clockwise (positive) direction.
3. If NA is low, the ring counter moves in a counter clockwise (negative) direction.
4. If BIT0, the lowest bit of the address group (Al, AO) which generates the factors is low, the ring always move in the clockwise direction.
6. If BIT0 is high, and WRAP2 and/or INTERLV is high, move in the counter clockwise direction.
7. If BIT0 is high, WRAP2 and INTERLV are low, move in the clockwise direction.

The consideration for WRAP2 in the numbered explanation above for items 6 and 7 come from the observation that a 2 bit burst only requires the unique bit to move once from it is initial position. Using a four bit column factor counter, the unique bit must be contained in the lower two positions if it started one of The two lower positions. Else, the bit must be contained in the upper two positions if it starred in the upper two positions. The Serial or Interleave mode does not have an effect. If the least significant column address is a zero, the unique bit must move to a higher column factor (i.e. from CF0 to CF1, or CF2 to CF3). If the least significant column address is a one, the unique bit must move to a lower position (i.e. from CF1 to CF0, or CF3 to CF2).

In FIG. 3c, an alternate control logic is shown which replaces logic section 10 of FIG. 3a, for CFC and CFD. This logic must only determine if the rotation should be positive or negative. CFC and CFD will always rotate in a positive or clockwise direction unless INTERLV and the least significant bit of their associated column addresses is high. CFC and CFD are only used in a 256 bit burst; therefore, there are no other control logic considerations.

In FIG. 3d, an alternate control logic is shown which replaces logic section 10 of FIG. 3a, for CFB. This logic determines if the rotation should be positive or negative with respect to the four bit ring, or if two, 2 bit rings should be used in an 8 bit burst. If WRAPS is low, indicating that the current burst length is not an 8 bit burst, the outputs NA, NAB, NB, and NBB set the 2:1 mix passgates exactly e those controlled through FIG. 3c. If WRAP8 is high, rotation is not determined by Serial or Interleave modes because a two bit ring will cycle to the same position regardless of whether it rotated clockwise or counter clockwise. WRAP8 high will connect CF4 to CF5, CF5 to CF4, CF6 to CF7, and CF7 to CF6. This is accomplished by allowing NB to replace NAB, and NBB to replace NA in FIGS. 3a and 3b for XCP1, XCP6, XCP13, and XCP18. The NA and NAB in FIG. 3d go to the same circuits as those shown in FIGS. 3a and 3b, except those described above.

The operation of the bidirectional counter of FIGS. 3a and 3b will now be explained in conjunction with the timing diagram of FIG. 9

In FIGS. 3a and 3b, beginning with the logic portion 14 of the counter which enumerates CF2, when the external column address strobe CAS_fires, the internal signal CASP_ fires in response thereto and the passgate X2CP1 closes so that CF2_flows through and goes into a signal inverter X3IV2 thereby forms the output CF2. Hence, on the first cycle, CF2_is simply inverted to make CF2. Note, however that the output of inverter X3IV2 is input to inverter XIV6 which forms a latch, to hold the data there. The CASP_ signal goes away and is no longer making a connection, so the data can be held on the output. Notice that the output of inverter XIV6 is connected to node N12. Node N12 connects to the passgate XCP19 which is part of logic portion 12 of the counter which generates CF3. Additionally, node N12 is connected to passgate XCP12 which is part of logic portion 16 of the counter that generates CF1. So basically, the same output from CF2 is going into two circuits: CF3 which is one number above CF2; and CF1 which is one number below CF2.

FIGS. 3a and 3b, each of these groups of logic 12–18 have two passgates controlled by signals NA and NAB. For example, logic 12 has the passgates XCP19 and XCP24 controlled by NA and NAB. So that logic is determining whether the data flows through from the previous input or the higher input (working about in a clockwise or counter-lock rotation). So now the data has gone from N12 into one of these passgates, chose the top one XCP19 of logic portion 12 which generates CF3 for now. NA and NAB are not pulse signals, they are steady state signal dependent only on the mode register and in some cases the least significant column address on the initial load. Once it is determine which way to rotate, the rotation occurs in that direction all the time. So N12 goes into the top passgate XCP19 of the CF3 logic 12, which is at the top. For that passgate to be connected, NA is high and NAB is low. This keeps the top passgate XCP19 connected and the bottom passgate XCP24 disconnected. So, the information of CF2_from node N12 goes into an inverter XIV50 for inverting and buffering purposes.

Figure 9:
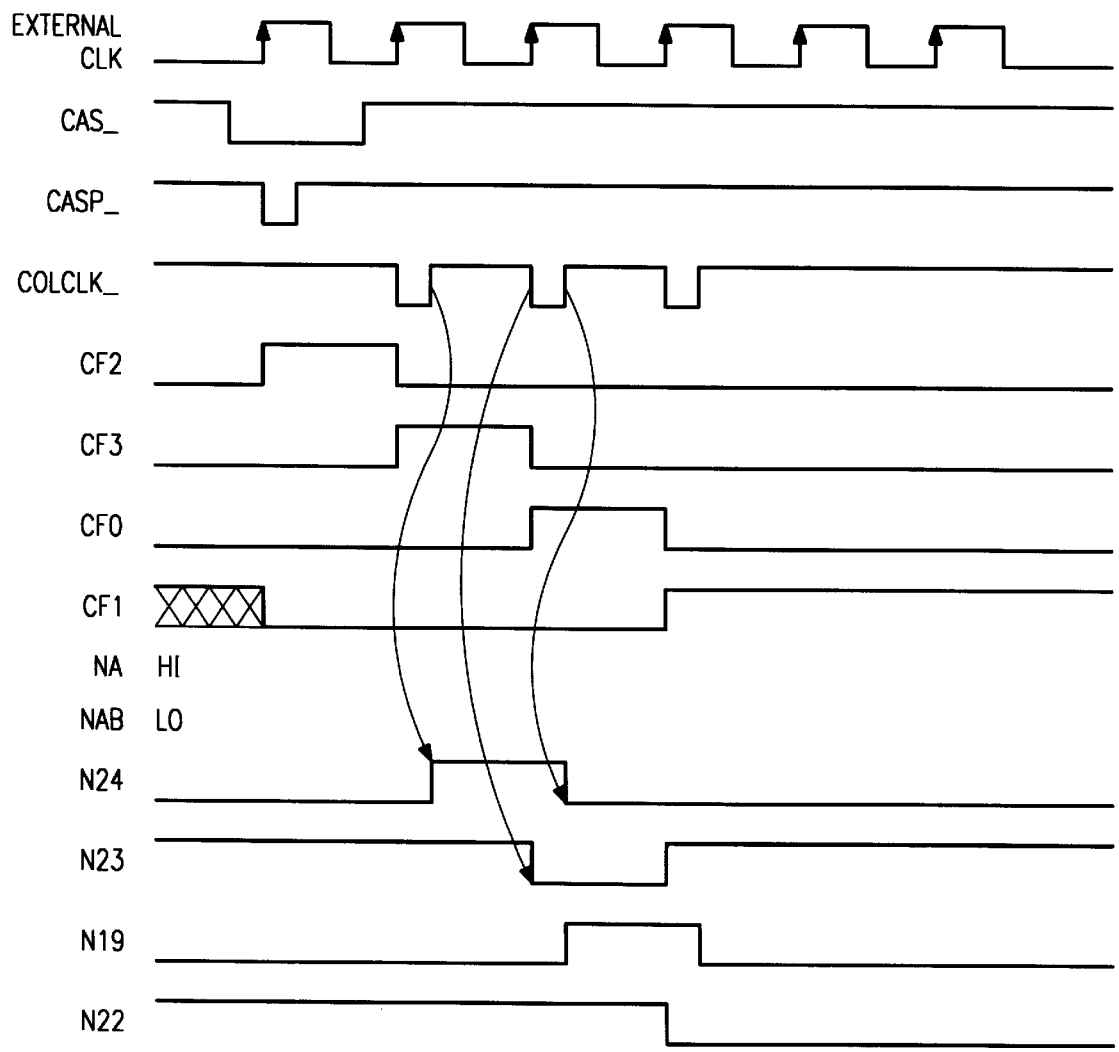
FIG. 9 is a timing diagram illustrating a method of operation of the electrical schematic of FIGS. 3a and 3b.

In FIGS. 3a, 3b, and 9, COLCLK_is a low enable signal so it is not going to go low until the next external system clock occurs. Notice that COLCLK and COLCLK_are connected to passgate XCP50 of logic 12. From XCP50, the data then flows into inverter VIV18 which has node N8 on input and node N28 on it's output. Inverter XIV18 and XIV25 effectively form a latch. What has effectively happened thus far is that the data out CF2_, has come around through a passgate to an inverter into another passgate into a latch having nodes N8 and N28. Now the data is sitting in this latch waiting for COLCLK_ to go low. When this occurs, the passgate XCP50 between N16 and N8 (which is the one just before the latch) opens up and data no longer flows. However, the passgate X2CP8 after the latch (which is connected to N28) closes, so the data from the latch at node N28 goes into the output latch formed by inverters X3IV1 and XIV8 which is connected to CF3. All the data does is flow through from the N28 latch through the passgate, into this X3IV1/XIV8 latch setup which goes out to CF3. When COLCLK_goes high, the output latch X3IV1I8 is isolated from being changed until the next COLCLK_. Also, the XCP50 passgate, which prevented the XIV18/NIV25 from being corrupted while loading the X3IV1/XIV8 latch, is again reconnected so that new data can be loaded into the X3IV1/XIV8 latch for the next cycle. Then the cycle starts all over again.

Continuing with reference to FIGS. 3a, 3b, and 9, in logic portion 12, while we have the output latch formed by inverters X3IV1 and XIV8 the data in CF3_flows around and goes into logic portion 18 (via passgate XCP13) which generates CF0 in the next cycle. So if we take a look at node N7, the N8/N28 latch provided the signal that went through a passgate X2CP8, then just after that passgate is N7. Node N7 connects to logic portion 18 via passgate XCP13 and connects into logic portion 16 via passgate XCP6. Because of the rotation we chose, the data at node N7 is going to choose the CF0 logic, simply because we went from CF2 to CF3 and now we have to go CF3 to CF0. This is a positive or clockwise rotation. As soon as COLCLK_ fires again, the data flows through logic portion 18 that generates CF0. The cycle keeps reappearing. The only thing that may change is maybe if we are in an Interleave mode, instead of having the passgate that was closed, it would be the other one passgate in the 2:1 mux of each logic section 12,14,16, and 18.

In FIGS. 2, 3a, and 3b, the signal WRAPDN_ shuts off COLCLK_ from firing anymore. So if we have a 4 bit burst, CASP_ fires the 1st cycle and COLCLK_ will fire 3 cycles. If we have had a 8 bit burst, CASP_would fire the 1st cycle and COLCLK_ would fired the 7 cycles. COLCLK_ would like to continue to fire, but WRAPDN_ is the signal that says stop. Because of the timing of the circuitry, the CWRAPDN circuit needs to know when to fire WRAPDN_ one cycle in advance. To accomplish an exit signal one cycle before WRAPDN_ fires, the CMPx circuits must determine the exit condition even one cycle earlier. This is called a two stage look-ahead. The conditions used to determine when the two stage look-ahead signal should be generated was discussed earlier.

We want something to happen eventually two cycles ahead of where we are now. So what are we going to use are these signals called NXTCF0 through NXTCF3. Next Column Factor 0 (NXTCF0) is the output of the inverter XIV35, which has the input from the latch stage connected to N24 and N25, that latch contains the data that will be output to CF0 one cycle into the future. So we've got an indicator now of what's happening one cycle ahead of where you want to be so now we can send that off into the comparitor circuitry which is CMPA through CMPD (FIG. 2) that can compare this information with the state of the column factors when they were initially loaded at the beginning of the count. The output of the comparitor, CMPA, into circuit CWRAPDN then generates signal WRAPDN_on the next cycle, which stops COLCLK__. This is how the two stage carry look-ahead is produced.

Continuing now with explanation of ring counter and with her explanation of FIGS. 2, 3a, and 3b, the basic element of the ring counter can be linked together to form $2^N$ lengths rings when N=1, 2, 3, etc. Because we do not want the output from one counter to go into the next and disrupt the information in that ring position until the transition is complete, passgates controlled by COLCLK_ and COLCLK have been added. These close the new information from entering the latch while CFx is being updated. An example is in logic section 12, with the oppositely controlled passgates XCP50 and X2CP8. Also, only one of the two passgates for the 2:1 mux will be active, depending on the direction of rotation. The "NXTCFx" output has been added for the look-ahead comparison to set up the next higher ring increment, or when to stop the COLCLK_at the end of a burst.

This approach generates a very high speed counter. By using this design and the advantages of a counting scheme like the Interleave mode (any non-pulled by ones count), the design provides a simple and robust design. By using the above design rules, the following circuitry has been designed. It supports 1, 2, 4, 8, and 256 burst lengths with a two stage look-ahead exit comparator. Speeds up to 6.5 ns cycle time are possible, even a large amount of redundant Y-selects used in the address space. A "pulled by ones" increment refers to any counting scheme requiring that a condition on multiple lower bits be made to increment one or all of the positions. A serial count is a pulled by ones scheme. A bit increments in a sequential count when all lower bits equal one. This requires that the increment constraint ripple through multiple layers of logic, and is therefore, slow in operation.

Although the present invention has been described in detail, it should be understood that various changes, substitutions, and alterations can be made without departing from the spirit and scope of the invention as defined by the appended claims.

What is claimed is:

1. An integrated circuit comprising:
   a memory array comprised of rows and columns of memory cells;
   column address decoding circuitry connected between a plurality of address input terminals and the memory array comprising:
   a first column address factor generator connected to receive N address signals at its input, wherein N is an integer, and to generate a first set of $2^N$ column address factors at its output, and wherein only one of the first set of $2^N$ column address factors from the first column address factor generator has an active level and the remainder of the first set of $2^N$ column address factors from the first column address factor generator have an inactive level;
   a second column address factor generator connected to receive M address signals at its input, wherein M is an integer, and to generate a second set of $2^M$ column address factors at its output, and wherein only one of the second set of $2^M$ column address factors from the second column address factor generator has the active level and the remainder of the second set of $2^M$ column address factors from the second column address factor generator have the inactive level;
   a column address factor counter comprising:
   a first counter having inputs coupled to the first set of $2^N$ column address factors and having a first plurality of count positions, the first counter operable to store the first set of $2^N$ address factors in the first plurality of count positions and to increment the first set of $2^N$ column address factors in either the up or down direction by shifting the first set of $2^N$ address factors to adjacent higher or lower count positions and providing a first incremented set of $2^N$ column address factors at its output, and wherein only one address factor from the first incremented set of $2^N$ column address factors has the active level;
   a second counter having inputs coupled to the second set of $2^M$ column address factors and having a second plurality of count positions, the second counter operable store the second set of $2^M$ address factors in the second plurality of count positions and to increment the second set of $2^M$ column address factors in either the up or down direction by shifting the second set of $2^M$ address factors to adjacent higher or lower count positions and providing a second incremented set of $2^M$ column address factors at its output, and wherein only one address factor from the second incremented set of $2^M$ column address factors has the active level;
   a final decode circuit connected to receive and decode the first incremented set of $2^N$ column address factors and the second incremented set of $2^M$ column address factors and to generate a set of final column decoded signals.

2. The integrated circuit of claim 1, wherein the active level is a high logic level and the inactive level is a low logic level.

3. The integrated circuit of claim 1, wherein only one of the final column decoded signals is of the active level.

4. The integrated circuit of claim 1 further comprising a control circuit connected to the first and second counters to determine the direction of the increment for each of the first and second counters.

5. The integrated circuit of claim 1, wherein the memory cells are dynamic random access memory (DRAM) cells and the column address factor counter is a burst counter.

6. The integrated circuit of claim 1, wherein the column address factor counter is capable of counting in either the serial or interleave methods.

7. The integrated circuit of claim 4, wherein the control circuit is also connected to allow the second counter to increment only when the one of the first set of $2^N$ column address factors from the first column address factor generator with the active level stored in the first counter transitions from the highest count position in the first counter to the lowest count position in the first counter.

8. The integrated circuit in claim 4, wherein the control circuit is also connected to allow the second ring counter to increment only when the one of the first set of $2^N$ column address factors from the first column address factor generator with the active level stored in the first ring counter transitions back to its original starting count position.

9. The integrated circuit of claim 1, wherein the first and second counters each comprise a shift register and wherein each of the first and second plurality of count positions comprise a latch.

10. The integrated circuit of claim 9 further including passgates connected between the latches to allow shifting of the first and second sets of column address factors among count positions in the first and second counters respectively.

11. The integrated circuit of claim 1, wherein N is 2.

12. The integrated circuit of claim 11, wherein M is 2.

13. The integrated circuit of claim 4, wherein the control circuit comprises a latch.

14. The integrated circuit of claim 4 further comprising a mode register connected to store information regarding the number times the column address factor counter must increment and also to store information regarding the count method.

15. An integrated circuit comprising:
a memory array having a plurality of rows and columns of memory cells;
a first address decoding circuit connected to receive a first plurality of address input signals and output a first set of column address factor signals at its output;
a second address decoding circuit connected to receive a second plurality of address input signals and output a second set of column address factor signals at its output;
a first counter circuit, the first counter circuit connected to receive the first set of column address factor signals, the first counter circuit comprising a plurality of count positions coupled to the output of the first address decoding circuit to store the first set of column address factor signals, the first counter circuit incrementing the first set of column address factor signals in either the up or down direction by shifting the first set of column address factor signals to adjacent higher or lower count positions in the first counter circuit depending on the direction of the increment;
a second counter circuit, the second counter circuit connected to receive the second set of column address factor signals, the second counter circuit comprising a plurality of count positions coupled to the output of the second address decoding circuit to store the second set of column address factor signals, the second counter circuit incrementing the second set of column address factor signals in either the up or down direction by shifting the second set of column address factor signals to adjacent higher or lower count positions in the second counter circuit depending on the direction of the increment;
a control circuit connected to the first and second counter circuits to determine the direction of the increment for the first and second counter circuits respectively and to cause the second counter circuit to increment depending on the state of the first counter circuit.

16. The integrated circuit of claim 15, wherein only one of the first set of column address factor signals is a high logic level and the remainder of the first set of column address factors signals are a low logic level.

17. The integrated circuit of claim 15, wherein the memory cells are dynamic random access memory (DRAM) cells.

18. The integrated circuit of claim 15, wherein the first and second counter circuits are capable of counting in either a serial or an interleave methods.

19. The integrated circuit of claim 16, wherein the control circuit will cause the second counter circuit to increment only when the one of the first set of column address factor signals with the high logic level stored in the first counter circuit transitions from the highest count position in the first counter circuit to the lowest count position in the first counter circuit.

20. The integrated circuit in claim 16, wherein the control circuit will allow the second counter circuit to increment only when the one of the first set of column address factor signals with the high logic level stored in the first counter circuit transitions back to its original starting count position.

21. The integrated circuit of claim 15, wherein each of the first and second counter circuits comprise a shift register and wherein each of the first plurality of count positions and each of the second plurality of count positions comprise a latch and wherein the first and second counter circuits include passgates connected between the latches to allow shifting of the first and second sets of column address factor signals among the latches in the first and second counter circuits respectively.

22. The integrated circuit of claim 15, wherein the control circuit comprises a latch.

23. The integrated circuit of claim 15 further comprising a mode register connected to store information regarding the number times the first counter circuit must increment and to store information regarding the count method.

24. An integrated circuit comprising
a bidirectional counter circuit comprising:
a first ring counter connected to receive a first set of at least two input signals and to generate a first output count, the first set of input signals are comprised of only one active level signal and the remainder of the input signals in the first set are inactive level signals, the first ring counter having a plurality of count positions to store the first set of input signals and operable to count in either the up or down direction by shifting the first set of input signals to the next higher or lower count position in the first ring counter depending on the direction of the count and wrapping from the lowest count position to the highest count position or from the highest count position to the lowest count position in the first ring counter dependant on the direction of the count;

a second ring counter connected to receive a second set of at least two input signals and to generate a second output count, the second set of input signals are comprised of only one active level signal and the remainder of the input signals in the second set are inactive level signals, the second ring counter having a plurality of count positions to store the second set of input signals and operable to count in either the up or down direction by shifting the second set of input signals to the next higher or lower count position in the second ring counter depending on the direction of the count and wrapping from the lowest count position to the highest count position or from the highest count position to the lowest count position in the second ring counter depending on the direction of the count; and a control circuit connected to the first and second ring counters to determine the direction of the count for each of the first and second ring counters and to allow the second ring counter to increment depending on the state of the first ring counter.

25. The integrated circuit in claim 24, wherein the bidirectional counter circuit is capable of counting in either a serial or an interleave methods.

26. The integrated circuit in claim 24, wherein the one active signal in each of the first and second ring counters is a high level signal.

27. The integrated circuit in claim 26, wherein the control circuit will cause the second ring counter to increment when the one active signal in the first ring counter transitions from the highest count position in the first ring counter to the lowest count position in the first ring counter.

28. The integrated circuit in claim 26, wherein the control circuit will allow the second ring counter to increment when the one active signal in the first ring counter transitions back to its original starting position.

29. The integrated circuit of claim 28, further comprising:

a memory array comprised of rows and columns of memory cells, the memory array coupled to the outputs of the bidirectional counter circuit;

a first column factor generator coupled to the inputs of the first ring counter, the first column factor generator receives a first set of address bits at its input and generates the first set of input signals at its output; and a second column factor generator coupled to the inputs of the second ring counter, the second column factor generator receives a second set of address bits at its input and generates the second set of input signals at its output.

30. The integrated circuit of claim 29, wherein the control circuit determines the direction of the count for the first ring counter by evaluating the logic level of the lowest address bit of the first set of address bits; and wherein the control circuit determines the direction of the count for the second ring counter by evaluating the logic level of the lowest address bit of the second set of address bits.

31. The integrated circuit of claim 29, wherein the memory cells are dynamic random access memory (DRAM) cells.

32. The integrated circuit of claim 30, wherein the direction of the count of the first ring counter is down if the logic level of the lowest address bit of the first set of address bits is high, and the direction of the count of the first ring counter is up if the logic level of the lowest address bit of the first set of address bits is low.

33. The integrated circuit of claim 32, wherein the direction of the count of the second ring counter is down if the logic level of the lowest address bit of the second set of address bits is high, and the direction of the count of the second ring counter is up if the logic level of the lowest address bit of the second set of address bits is low.

34. The integrated circuit of claim 24, wherein the first and second ring counters each comprise a shift register and wherein each count position comprises a latch.

35. The integrated circuit of claim 29 further comprising a final decoding circuit, the final decoding circuit receiving the first and second output counts from the first and second ring counters as inputs and having a plurality of outputs connected to column select devices of the memory array.

36. The integrated circuit of claim 24, wherein the bidirectional counter is a column burst counter in a synchronous random access memory (SDRAM) device.

37. The integrated circuit of claim 36 further comprising a second control circuit connected to the first and second ring counters to generate an exit signal indicating when the column burst is nearing completion.

38. The integrated circuit of claim 37, wherein the second control circuit is a two-stage look-ahead comparator.

39. The integrated circuit of claim 36 further comprising a mode register connected to store information regarding the number times the first ring counter must increment and to store information regarding the count method.

40. A method of accessing memory locations in a memory array comprising:

applying a first plurality of address signals to a first address factor generator and generating a first plurality of address factors therefrom, the first plurality of address factors comprising only one active level signal and the remainder of the first plurality of address factors being inactive level signals;

applying a second plurality of address signals to a second address factor generator and generating a second plurality of address factors therefrom, the second plurality of address factors comprising only one active level signal and the remainder of the second plurality of address factors being inactive level signals;

storing the first plurality of address factors in a plurality of count positions in a first counter circuit;

storing the second plurality of address factors in a plurality of count positions in a second counter circuit;

determining the direction of increment for the first and second plurality of address factors in the first and second counter circuits respectively;

incrementing the first plurality of address factors in the first counter circuit;

determining whether the second plurality of address factors in the second counter circuit should be incremented depending on the state of the first plurality of address factors in the first counter circuit.

41. The method of claim 40, wherein the active level is a high logic level and the inactive level is a low logic level.

42. The method of claim 41 further comprising:

incrementing the second plurality of address factors in the second counter circuit; and applying the incremented first and second plurality of address factors from the first and second counter circuits respectively to a final decoding circuit and generating a final set of decoded signals, and wherein only one of the final set of decoded signals is an active level signal.

43. The method of claim 40, wherein the memory array is a dynamic random access memory (DRAM) array.

44. The method of claim 40, wherein the step of incrementing the first plurality of address factors in the first counter circuit is done in a serial mode.

45. The method of claim 40, wherein the step of incrementing the first plurality of address factors in the first counter circuit is done in a interleave mode.

46. The method of claim 40, wherein the step of determining whether the second plurality of address factors in the second counter circuit should be incremented comprises determining whether the one active level signal from the first plurality of address factors stored in the first counter circuit transitions from the highest count position in the first counter circuit to the lowest count position in the first counter circuit.

47. The method of claim 40, wherein the step of determining whether the second plurality of address factors in the second counter circuit should be incremented comprises determining when the one active level signal from the first plurality of address factors stored in the first counter circuit transitions back to the count position it was first stored in.

48. The method of claim 40, wherein each of the plurality of count positions in the first and second counter circuits comprises a latch.

49. The method of claim 40 further comprising the step of storing information in a mode register to indicate the number of times the counter must increment and the method of incrementing.

50. The method of claim 49, wherein the number of times the counter must increment is an 8 bit burst and the method of incrementing is a interleave method.

51. The method of claim 49, wherein the number of times the counter must increment is a 4 bit burst and the method of incrementing is a serial method.

52. The method of claim 40 further comprising generating an exit signal when the count is nearing completion.

53. The method of claim 52, wherein the step of generating an exit signal comprises using a two-stage look ahead comparator to determine when the count is two increments from completion.

\* \* \* \* \*